US006545329B1

(12) United States Patent
Lannon, Jr. et al.

(10) Patent No.: US 6,545,329 B1
(45) Date of Patent: Apr. 8, 2003

(54) HIGH SENSITIVITY POLARIZED-LIGHT DISCRIMINATOR DEVICE

(75) Inventors: John M. Lannon, Jr., Raleigh, NC (US); David E. Dausch, Raleigh, NC (US); Dorota Temple, Cary, NC (US)

(73) Assignee: MCNC, Research Triangle Park, NC (US)

( * ) Notice: Subject to any disclaimer, the term of this patent is extended or adjusted under 35 U.S.C. 154(b) by 0 days.

(21) Appl. No.: 10/045,356

(22) Filed: Oct. 23, 2001

(51) Int. Cl.[7] .................. H01L 27/14; H01L 29/82; H01L 29/84
(52) U.S. Cl. .............. 257/414; 257/431; 257/437
(58) Field of Search .................. 257/414, 431, 257/437, 21, 449; 438/48, 49, 70

(56) References Cited

U.S. PATENT DOCUMENTS 4,952,811 A * 8/1990 Elliott .................. 250/370.13

* cited by examiner

Primary Examiner—Tom Thomas
Assistant Examiner—Thien F Tran
(74) Attorney, Agent, or Firm—Alston & Bird LLP

(57) ABSTRACT

The present invention provides for an improved polarized-light detector device. The device comprises a photodiode having a first contact disposed on the backside of a light-sensing medium and a second contact disposed on the frontside of the light-sensing medium. A spin filter medium is disposed between the backside of the light-sensing medium and the first contact. The application of a magnetic field aligns the magnetic moments in the spin-filter medium to cause the device to discriminate between different polarizations of an optical signal. The polarization discrimination is affected by introducing a net magnetization into the spin filter medium, thereby allowing selected spin-polarized electrons to either be transmitted through the spin filter medium to the point of detection or deflected from further transmission. Additionally, the invention is embodied in a polarization-selective-light detector array and methods for discriminating a polarized optical signal and selective optical wavelength detection.

38 Claims, 4 Drawing Sheets

HIGH SENSITIVITY POLARIZED-LIGHT DISCRIMINATOR DEVICE

FIELD OF THE INVENTION

The present invention relates to optical detectors, and more particularly to an integrated solid state light-sensing device that discriminates between different polarizations of optical signals, arrays incorporating such light sensing devices and the corresponding methods for using such devices.

BACKGROUND OF THE INVENTION

Conventional polarized-light detectors will typically require the use of polarizing filters/lenses that are positioned proximate the photodetector to achieve detection of the selected polarization. In this manner, a discrete filter and/or lens is required for each particular polarization detection scheme. As such, these detectors tend to add bulk and size to the overall light detection systems. Additionally, filtered optical signals tend to decrease the degree of sensitivity of the detection process because less of the optical signal ultimately reaches the light-sensing medium in the photodetector.

The need exists to develop a polarized-light detector that will eliminate the need to incorporate external filters and/or lenses, thereby, decreasing the size of such optical detection systems and allowing a greater degree of sensitivity and polarization discrimination capability. Such a device would have widespread application in optical spectrometry, for example, gas sensing or characterization. Additionally, enhancements in data encryption for optical telecommunications could be realized if the polarized-light detector allows for the detection of optical signals transmitted on a selected polarization of light.

Recent advancements in optical communication technology have led to the development of solid state polarized light emitters that incorporate the use of magnetic materials in conjunction with light emitting media. By incorporating these magnetic materials, such as Giant Magnetoresistance (GMR) materials or Dilute Magnetic Semiconductor (DMS) materials, the emitters eliminate the need for optical filters and/or lenses that would typically be used to convert the emitted light to the desired polarization (i.e., right.circularly polarized, left circularly polarized, etc.). In addition, by changing the direction of the applied magnetic field, it is possible to alter the type of polarized light emitted. The resulting emitters occupy less space, are generally more efficient and typically provide for devices that can be manufactured at a lower cost.

A GMR multilayer stack operates under the principle that very large changes in resistance can be realized in materials comprised of alternating very thin layers of various metallic elements. The general structure of GMR multilayer stacks is alternating ferromagnetic and non-ferromagnetic spacer layers, each a few atomic layers thick. The thickness of the spacer layer is such that the magnetic moments of successive ferromagnetic layers are aligned anti-parallel to each other in the absence of an applied magnetic field. It is observed that the resistance of the structure is much higher when the magnetic moments of the adjacent magnetic layers are aligned antiparallel than when they are parallel. Switching from the antiparaliel to the parallel configuration can be achieved by an applied magnetic field. This effect is referred to as giant magnetoresistance (GMR).

Dilute magnetic semiconductors (DMSs), based on manganese doped II–VI and III–V host materials, for example, have recently received a large amount of attention for their unique combination of magnetic and electronic properties. DMSs are formed by substituting a fraction of cations with a magnetic ion. These alloys exhibit a variety of novel magneto-optical properties coming from the exchange interaction between the magnetic ions and the conduction or valence electrons (s±p exchange interaction).

By incorporating a spin filter layer in a polanrzed-light detector it is possible to eliminate the need to incorporate external filters and/or lenses in the detector construct. This improvement would decrease the size of such optical detection systems and allow a greater degree of sensitivity and polarization discrimination capability.

SUMMARY OF THE INVENTION

The present invention provides for an improved integrated solid state light-sensing device that discriminates between different polarizations of light. The device incorporates a spin filter layer between the light-sensing medium and the backside contact of a conventional photodiode structure. Standard polarized-light detectors require the use of polarizing filters and/or lenses that are typically placed in front of the photodetector. The present invention eliminates the need for polarizing lenses and/or filters, thereby decreasing the overall size and complexity of a light detection system. Additionally, by providing for the capability to change the magnetization direction in the spin filter layer, the device's sensitivity can be altered from a first polarization to a second polarization. The degree of sensitivity of the device should be heightened due to the device's capability to allow the entire incident optical signal to reach the light-sensing medium unfiltered.

A polarized-light discriminator device according to the present invention comprises a conventional photodiode having a first contact disposed on the backside of a light-sensing medium and a second contact disposed on the frontside of the light-sensing medium. A spin filter medium, typically a Giant Magnetoresistance (GMR) multilayer stack, a Dilute Magnetic Semiconductor (DMS), or a ferromagnetic layer is disposed between the backside of the light-sensing medium and the first contact.

Polarized light incident on the light sensing medium excites electrons with a preferred spin polarization into the conduction band of the light-sensing medium. The spin polarization preference is governed by selection rules for the light sensing medium and the type of light polarization. The application of a reverse bias voltage to the first and second contact causes the optically excited, spin polarized electrons in the light-sensing medium to move toward the spin filter medium and the first contact. In the presence of a magnetic field, typically proximate to the spin filter medium, a net magnetization will be induced in the spin filter medium. The magnetic field may be an external magnetic field, a local magnetic field, or any other magnetic field suitable for inducing a net magnetization in the spin filter medium. The direction of induced magnetization determines the type of spin polarized electrons transmitted (or reflected) by the spin filter medium.

The device typically incorporates an anti-reflective coating layer disposed on the frontside of the light-sensing medium (i.e., the optical signal receiving side of the photodiode) that serves to increase the amount of the incident optical signal that reaches the light-sensing medium. In embodiments in which the second contact is a grid-like array of one or more contact pads the anti-reflective coating layer generally surrounds the one or more contact pads. In embodiments in which the second contact is a transparent conductive layer, such as Indium Tin Oxide or the like, the anti-reflective coating layer may be formed directly on the frontside of the light-sensing medium followed by the transparent conductive layer or the transparent conductive layer may be formed directly on the frontside of the light-sensing medium followed by the anti-reflective coating layer.

In an alternate embodiment, the polarized-light discriminator device of the present invention comprises a light-sensing substrate having semiconductor characteristics, a spin filter layer, typically a GMR multilayer stack, a DMS material or a ferromagnetic material, disposed on the backside of the light-sensing substrate and a contact layer disposed on the spin filter layer. The frontside of the light-sensing substrate has disposed thereon an anti-reflective coating layer and one or more contacts. The application of a magnetic field to the spin filter layer causes the device to discriminate between different polarizations of light. The magnetic field may be external, local or the like, typically proximate to the spin filter layer and is applied to induce a net magnetization in the spin filter layer.

The invention is also embodied in a polarization-selective-light detector array that includes a plurality of photodiodes, each photodiode having a first contact disposed on the backside of a light-sensing medium and a second contact disposed on the frontside of the light-sensing medium. A spin filter medium is incorporated in each of the plurality of photodiodes such that the spin filter medium is disposed between the backside of the light-sensing medium and the first contact. Additionally, a variable wavelength splitter is positioned proximate the plurality of photodiodes for the purpose of segmenting an optical signal into individual wavelengths. In operation, a reverse bias potential difference is applied to the first and second contacts and a magnetic field is applied to the spin filter layer of the plurality of photodiodes to allow the device to determine the polarization states of the individual wavelength or, alternatively, a reverse bias potential difference is applied to select photodiodes within the array to independently address selected elements (i.e., passive matrix addressing). In a typical array, a magnetic field is positioned proximate to the array to induce a net magnetization in the spin filter medium of the plurality of photodiodes, thus allowing only spin compatible electrons to be transmitted to the first contact. Additionally, an anti-reflective coating layer will typically be disposed on the frontside of the light-sensing medium of each photodiode construct. The anti-reflective layer may be formed to surround the second contact of the photodiode in those embodiments in which the second contact comprises a grid-like array of contact. Conversely, in those embodiments in which the second contact comprises a layer of transparent conductive material, the anti-reflective layer will typically be formed directly on either the light-sensing medium or the transparent conductive material.

Further, the invention is embodied in a method for using the polarized-light discriminator device of the present invention. The method comprises the steps of transmitting a polarized optical signal into a polarized-light detector having a spin filter medium disposed on the backside of a light-sensing medium, a first contact disposed on the spin filter medium and a second contact disposed on the frontside of the light-sensing medium. The polarized optical signal excites spin-polarized electrons into the conduction band of the light-sensing medium. The application of a reverse bias current to the first and second contacts moves the spin-polarized electrons toward the spin filter medium and the first contact. A magnetic field is applied to induce net magnetization in the spin filter medium. The electrical field in conjunction with the magnetic field causes transmission of select electrons through the spin filter medium based upon the spin orientation of the electrons. In one embodiment of the invention the output current of the transmitted selected electrons is detected at the first contact.

In accordance with yet another embodiment of the invention, a method for selective optical wavelength detection comprises splitting a multiple wavelength optical signal into individual wavelength segments and transmitting the individual wavelength segments into an array of photodiodes. Each photodiode having a spin filter medium disposed on the backside of a light-sensing medium, a first contact disposed on the spin filter medium and a second contact disposed on the frontside of the light-sensing medium. Spin-polarized electrons are then excited within the light-sensing medium into the conduction band of the medium by the transmitted polarized optical signal. The application of a reverse bias current to the first and second contacts moves the excited spin-polarized electrons toward the spin filter medium and the first contact. A magnetic field is applied to induce net magnetization in the spin filter medium. The electrical field in conjunction with the magnetic field causes transmission of select electrons through the spin filter medium based upon the spin orientation of the electrons. The select electrons are then detected at the first contact by measuring the current output.

The light-sensing device of the present invention provides for the capability to discriminate between different polarizations of optical signals. In doing so it eliminates the need to provide for extraneous polarizing filters and/or lenses, thereby decreasing the size of known devices. Additionally, the present invention provides for a light polarization sensitive device that can be switched from one polarization to another by switching the electron spin that is transmitted through the spin filter layer.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
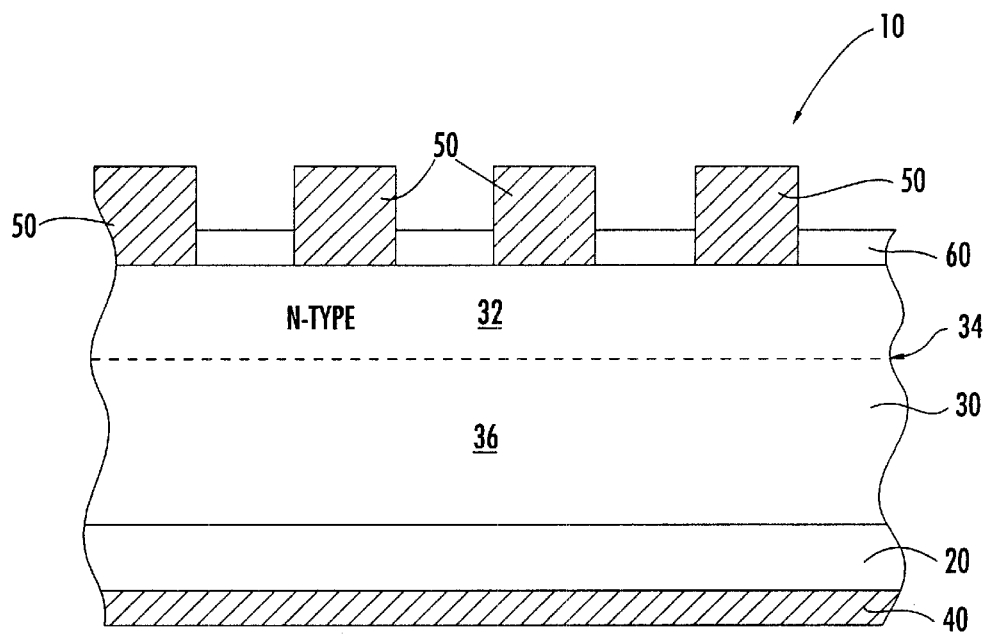
FIG. 1 is a cross-sectional view of a highly sensitive, polarized-light discriminator device, in accordance with an embodiment of the present invention.

Referring to FIG. 1, in accordance with the present invention a highly sensitive, polarized-light discriminator device 10 is depicted in cross-section. The device typically incorporates the structure of a conventional photodiode, such as a Schottky barrier diode or the like, with a spin filter layer 20 being disposed between the light-sensing medium 30 and the backside contact 40. The frontside of the light-sensing medium has disposed thereon one or more frontside contacts 50 and, in most embodiments, an anti-reflective layer 60 generally surrounds the frontside contact(s).

In operation, an optical source is directed toward the light-sensing medium 30 and incident photons in the optical beam excite electron-hole pairs in the n-type region 32 of the light-sensing medium. The polarization of the incident photons (i.e., left circularly or right circularly polarized), in conjunction with the allowed energy states of the light-sensing medium, will determine the preferred spin orientation of the excited electrons. An applied electric field causes the excited electrons to migrate toward the spin filter layer 20. A magnetic field, either external or local, is applied to the device to induce a net magnetization in the spin filter layer. Depending on the orientation of the magnetization in the spin filter medium, only electrons with a compatible spin polarization (i.e., parallel to the magnetization) are transmitted through the spin filter medium to the backside contact 40. In this manner, the electrons reaching the spin filter medium that have spin polarizations not aligned with the magnetization of the layer will be filtered (scattered) out. The transmitted electrons that reach the backside contact are then detected by an ammeter or other similar device.

The light-sensing medium 30 typically comprises an organic or inorganic semiconductor layer or multi-layer stack that is optically stimulated to act as an electrical conductor. For example, the light-sensing medium maybe formed of a traditional semiconductor substrate (such as gallium arsenide (GaAs), gallium nitride (GaN), silicon carbide (SiC) or the like), a polymer or semiconductor superlattice structure. As shown in FIG. 1, the light-sensing medium may comprise a region 32, adjacent to the frontside contacts 50 that has n-type semiconductor characteristics. The dotted line 34 indicates the transition point at which the light-sensing medium transitions from the n-type region to an intrinsic region 36 of the semiconductor. This embodiment is illustrative of a conventional avalanche photodiode structure that may be implemented in the present invention. It should be noted that FIG. 1 illustrates one embodiment of the invention and that other embodiments utilizing other photodiode structures, such as p-n diodes, p-i-n diodes and the like, are also within the inventive concepts herein disclosed. The light-sensing medium typically has a thickness in the range of about 0.001 millimeters (mm) to about 0.01 mm.

The spin filter layer 20 is disposed on the backside of the light-sensing medium 30. It will be understood by those having ordinary skill in the art that when a layer or medium is described herein as being "on" another layer or medium, it may be formed directly on the layer, at the top, bottom or side surface area, or one or more intervening layers may be provided between the layers. The spin filter layer may comprise a Giant Magnetoresistance (GMR) multilayer stack, a Dilute Magnetic Semiconductor (DMS) layer or a ferromagnetic material.

In the embodiments in which the spin filter layer 20 comprises a GMR multilayer stack, the stack may comprise alternating magnetic and non-magnetic layers, for example, iron/chromium/iron (Fe/Cr/Fe), cobalt/copper/cobalt (Co/Cu/Co), permalloy/copper/permalloy (FeNiCo/Cu/FeNiCo), etc. As typified by GMR stacks, the intermediate layer of the stack is a non-magnetic spacer (Cr, Cu, etc.) that isolates the two magnetic layers. In a typical embodiment of the present invention the GMR multilayer stack will have a thickness in the range of about 20 angstroms to about 200 angstroms, typically about 100 angstroms. The layers of the GMR stack are typically disposed using conventional semiconductor processing techniques, such as RF sputtering, ion beam sputtering or the like.

In the embodiments in which the spin filter layer 20 comprises a DMS layer, the layer comprises a semiconductor material doped with a metal ion such that the material exhibits ferromagnetic behavior. Examples of such semiconductor materials include gallium arsenide (GaAs), zinc selenide (ZnSe), cadmium telluride (CdTe) and the like and a suitable metal ion would be manganese (Mn) or the like. In a typical embodiment of the present invention the DMS layer will have a thickness of about 200 nanometers (nm) to about 400 nm. The DMS layer is generally disposed using conventional semiconductor deposition techniques, such as chemical vapor deposition (CVD) or the like.

In the embodiments in which the spin filter layer 20 comprises a ferromagnetic material, the layer may be formed of a single layer or a multilayer stack of ferromagnetic materials, such as iron (Fe) or the like.

The backside contact layer 40 is disposed on the spin filter layer 20. The backside contact layer will typically comprise a conductive material that is suitable to optical semiconductor devices. For example, gold may be used to form the contact layer. In a typical embodiment of the present invention the backside contact layer will have a thickness in the range of about 0.05 microns to about 0.5 microns. The backside contact layer is generally disposed using standard semiconductor deposition techniques, such as evaporation or sputtering.

The anti-reflective layer 60 is typically disposed on the frontside of the light-sensing medium 30 prior to providing for the one or more frontside contacts 50. The anti-reflective layer may comprise cerium oxide ($CeO_2$), magnesium fluoride ($MgF_2$), tantalum pentoxide ($Ta_2O_5$), silicon oxide ($SiO_2$), silicon nitride ($Si_3N_4$) or any other optical coating material that provides anti-reflective properties. The anti-reflective coating serves to reduce optical signal loss due to scattering of the signal at the light-sensing medium interface. The anti reflective coating layer can be deposited on the frontside of the light-sensing medium using an evaporation process or any other suitable semiconductor deposition process can be used to form the anti-reflective layer. Once the anti-reflective layer is formed a standard photolithography process is typically performed to define the regions where the one or more frontside contacts will be disposed. The photolithography process will entail applying photoresist, masking a predefined contact pattern and etching away those areas of the anti-reflective layer to define the frontside contact regions.

Figure 2:
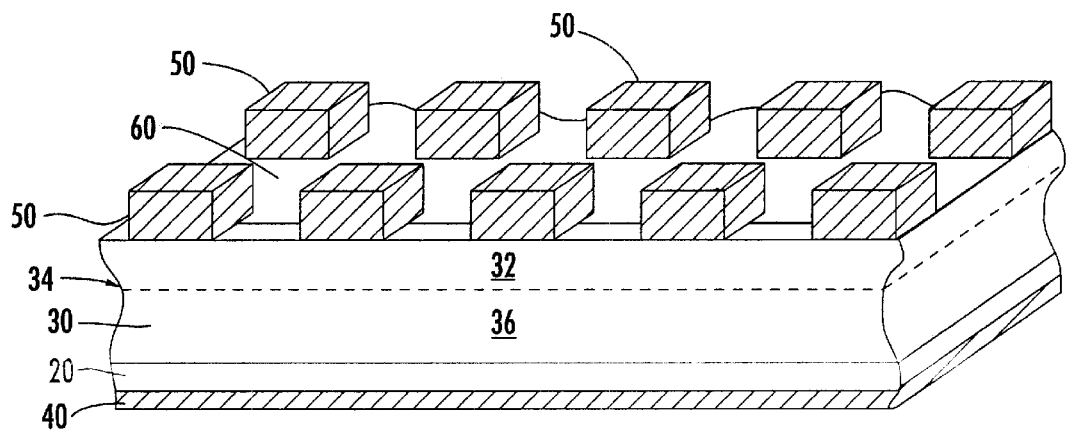
FIG. 2 is a perspective view of a highly sensitive, polarized-light discriminator device, in accordance with an embodiment of the present invention.

The one or more frontside contacts 50 are then disposed on the frontside of the light-sensing medium 30 within the openings in the anti-reflective layer 60 defined by the photolithography processing. A perspective view of the FIG. 1 embodiment is shown in FIG. 2. The FIG. 2 view illustrates an embodiment in which the frontside contacts are disposed in a grid-like array with the anti-reflective layer generally surrounding the frontside contacts. The frontside contacts will typically comprise a conductive material that is suitable to optical semiconductor devices. For example, gold may be used to form the frontside contacts. In a typical embodiment of the present invention the frontside contact layer will have a thickness in the range of about 100 angstroms to about 5000 angstroms. The one or more frontside contacts are generally disposed using standard semiconductor deposition techniques, such as evaporation or sputtering.

It should be noted that while the embodiment described herein appears to provide for a specific order of layering; i.e., constructing the backside layers prior to disposing the frontside layers, it is possible to process the layering of the device in any order that makes for efficient and reliable manufacturing. In other words, it is possible and within the inventive concepts herein disclosed to fabricate the device with the frontside layering preceding the backside layering or for processing of the backside and frontside layering to be alternated. In same regard, while the described processing provides for the anti-reflective layer 60 to be disposed prior to the formation of the frontside contacts 50, it may also be possible to fabricate the device by initially forming the frontside contacts followed by the deposition of the anti-reflective layer.

Figure 3:
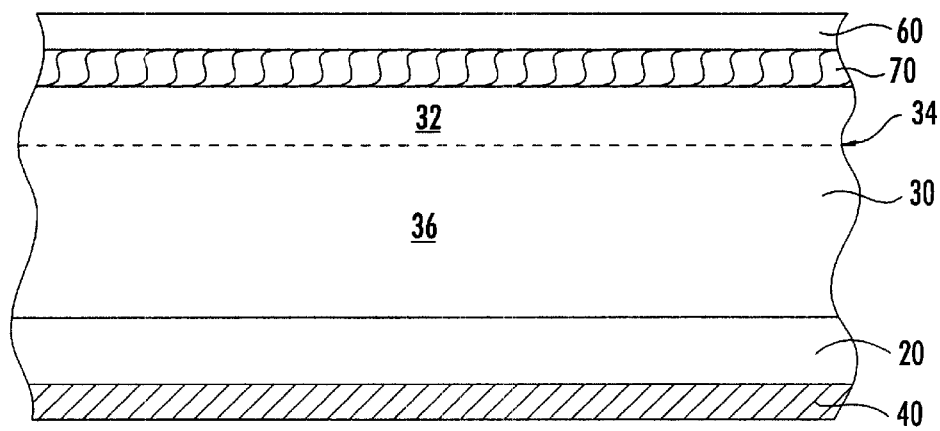
FIG. 3 is a cross-sectional view of an alternate embodiment highly sensitive, polarized-light discriminator, in accordance with an alternate embodiment of the present invention.

Referring to FIG. 3, an alternate embodiment of the highly sensitive polarized-light discriminator device 10 is illustrated in cross-section. In the embodiment shown the frontside contacts have been replaced with a transparent conducting material layer 70. The transparent conducting material layer may comprise Indium Tin Oxide (ITO) or any other suitable transparent conductive material. The transparent conducting material layer provides the same general purpose as the frontside contact(s) in the FIG. 1; i.e. electrical contact points for providing a reverse bias current to the light-sensing medium of the photodiode. However unlike the conventional contacts in the FIG. 1 embodiment, the transparent nature of the transparent conducting material makes it is possible to form a layer on the frontside of the light-sensing medium that covers the frontside in its entirety. As shown in FIG. 3, the transparent conductive material may be disposed directly on the light-sensing medium 30 with the anti-reflective layer 60 subsequently formed on the transparent conducting material layer. Additionally, it is possible and within the inventive concepts herein disclosed to form the anti-reflective layer directly on the light-sensing medium with the transparent conductive material layer subsequently formed on the anti-reflective material layer. The transparent conducting material layer will typically have a thickness in the range of about 100 angstroms to about 5000 angstroms. The transparent conducting material layer may be deposited using a conventional sputtering technique or other suitable methods, depending on the material of choice.

Figure 4:
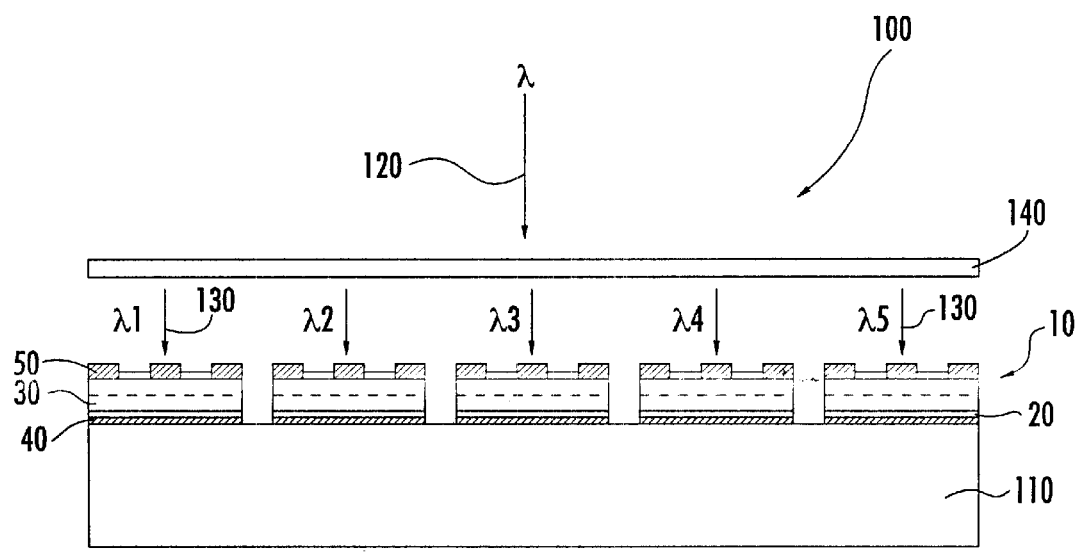
FIG. 4 is a cross-sectional view of a polarization selective-light detector array, in accordance with an embodiment of the present invention.

FIG. 4 is a cross-sectional view of a polarization selective-light detector array 100, in accordance with an embodiment of the present invention. The light detector array provides for the polarization detection of each wavelength in a multiple wavelength signal. Such an array has potential application within the field of optical light telecommunication data encryption. In this regard, the array would allow information to be encoded based upon the wavelength of the optical signal and the polarization of the optical signal.

The array comprises a series of polarized-light discriminator devices 10 disposed in array formation. Each polarized-light discriminator device will define a photodiode having a first contact 40 disposed on the backside of a light-sensing medium 30 and a second contact 50 disposed on the frontside of the light-sensing medium. Additionally, each discriminator device in the array will incorporate a spin filter layer 20 that is disposed between the light sensing medium and the backside contact. In the embodiment shown, the array is formed on substrate 110.

In order to segment the input optical signal 120 into wavelength specific segments 130, the light detector array will comprise a variable wavelength beam splitter 140 that is located proximate the plurality of polarized-light discriminator devices. Conventional diffraction gratings or prism structures may be implemented as wavelength beam splitters.

In operation, the array of the present invention would receive an optical signal at the variable wavelength splitter. The splitter would parse the optical signal into wavelength specific segments. In turn, the polarization of each of the wavelength specific segments would be determined by an individual light discriminator device within the array. In one embodiment of the present invention, each element in the array is individually electrically addressable such that each element can independently detect the polarization state of a given wavelength. In an alternate embodiment of the present invention, all elements in the array can be electrically addressable concurrently such that the array can detect the polarization state of all wavelengths to determine which wavelengths are "on" or "off" for a given polarization.

Figure 5:
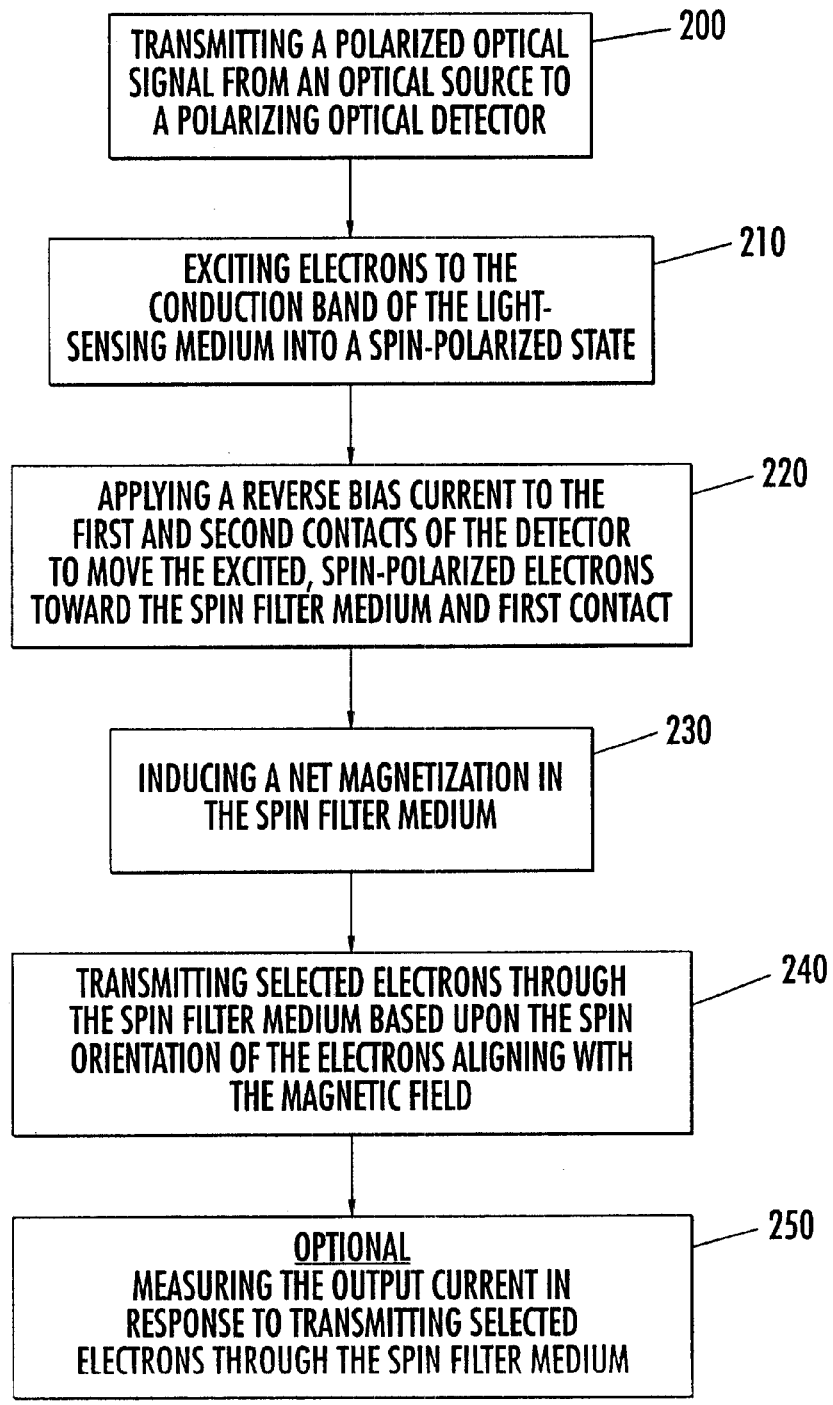
FIG. 5 is a flow diagram of a method for discriminating a polarized optical signal, in accordance with an embodiment of the present invention.

In accordance with another embodiment of the present invention, a method for discriminating a polarized optical signal is defined in the flow diagram of FIG. 5. At step 200, a polarized optical signal is transmitted from an optical signal source to a polarized-light detector. The polarized-light detector is in accordance with the polarized-light detector described in detail above and will incorporate a spin filter medium between the backside of a light-sensing medium and the backside electrical contact. At step 210, the polarized light excites electrons to the conduction band of the light-sensing medium into a spin-polarized state. An electrical field in the form of a reverse bias current is applied to the polarized-light detector, at step 220, to move the excited spin-polarized electrons toward the spin filter medium and the backside electrical contact. At step 230, a magnetic field is applied to induce a net magnetization in the spin filter medium and based on the magnetization in the spin filter layer, at step 240, selected electrons are transmitted through the spin filter medium based upon the spin orientation of the electrons aligning with the magnetization in the spin filter medium; only electrons with spin orientations parallel with the magnetization in the spin filter medium are transmitted. In addition, optional step 250 may be performed in which the selected electrons that have been transmitted through the spin filter medium are detected at the backside contact and output current is measured.

Figure 6:
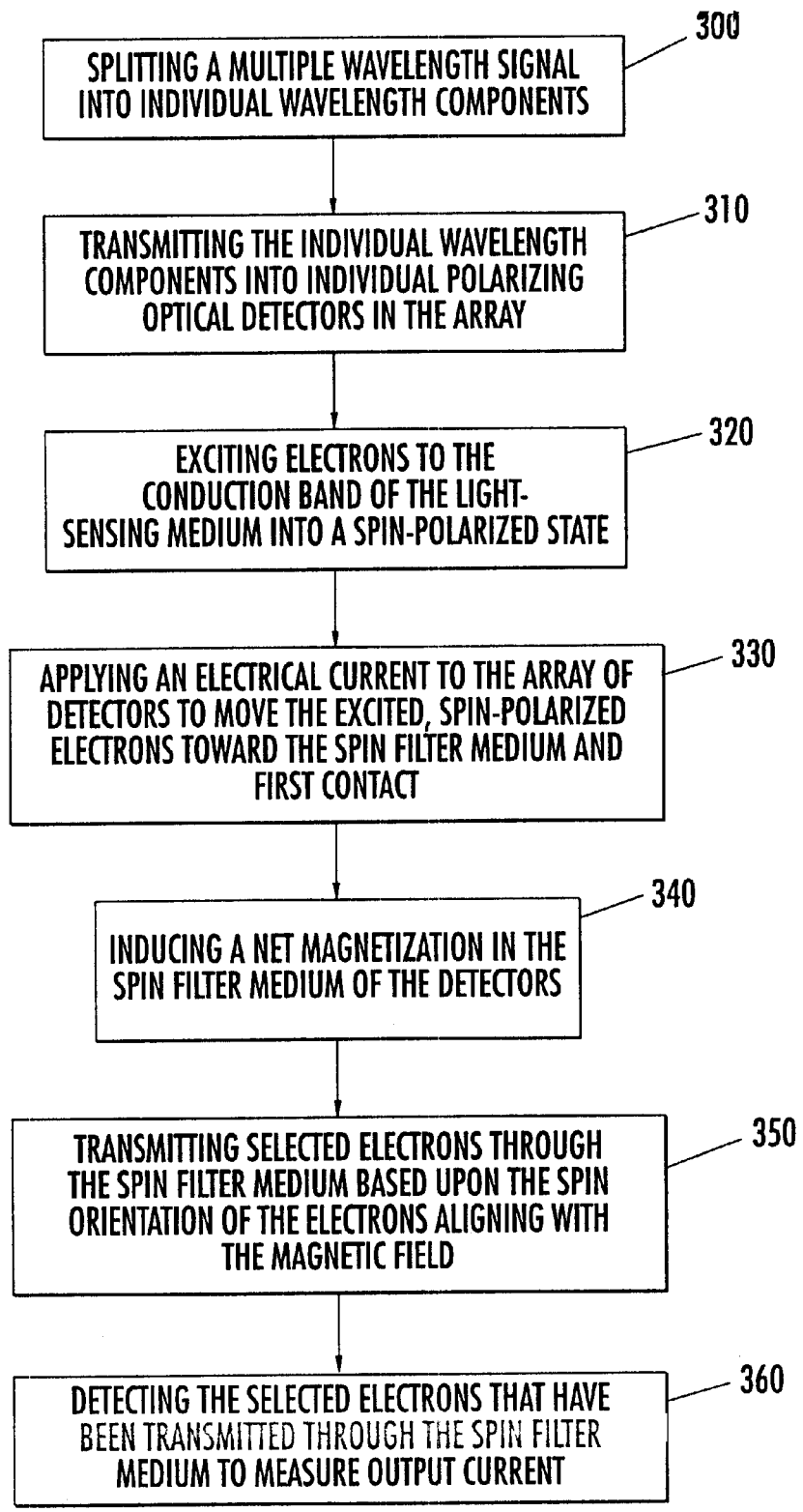
FIG. 6 is a flow diagram of a method for selective optical wavelength detection, in accordance with an embodiment of the present invention.

The invention is also defined in accordance with a method for selective optical wavelength detection. The method is detailed in the flow diagram of FIG. 6. At step 300, a multiple wavelength optical signal is split into individual wavelength components. The individual wavelength components are then, at step 310, transmitted into an array of polarized-light detectors. In this regard, one wavelength component is transmitted into one individual polarized-light detector. Each polarized-light detector will be in accordance with the polarized-light detector described in detail above and will incorporate a spin filter medium disposed between the light sensing medium and the backside electrical contact. At step 320, the polarized light excites electrons to the conduction band of the light-sensing medium into a spin-polarized state. An electrical field, in the form of a reverse bias current, is applied to the array of polarized-light detectors, at step 330, to move the excited spin-polarized electrons toward the spin filter medium and the backside contact. At step 340, a magnetic field is applied to induce a net magnetization in the spin filter medium and based on the magnetization in the spin filter layer, at step 350, selected electrons are transmitted through the spin filter medium based upon the spin orientation of the electrons aligning with the magnetization in the spin filter medium; only electrons with spin orientations parallel to the magnetization in the spin filter medium are transmitted. At step 360, the selected electrons that have been transmitted through the spin filter medium are detected at the backside contact and output current is measured.

Accordingly, the present invention provides for an improved light-sensing device that provides for the capability to discriminate between different polarizations of optical signals. In doing so it eliminates the need to provide for extraneous polarizing filters and/or lenses, thereby decreasing the size of known devices. Additionally, the present invention provides for a sensitive device that can be switched from one polarization to another by switching the electron spin that is transmitted through the spin filter layer.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limiting the scope of the present invention in any way.

That which is claimed:

1. A high-sensitivity, polarized-light discriminator device comprising:
    a photodiode having a first contact disposed on the backside of a light-sensing medium and a second contact disposed on the frontside of the light-sensing medium; and
    a spin filter medium disposed between the backside of the light-sensing medium and the first contact,
    wherein applying a magnetic field to the device aligns the magnetic moments in the spin filter medium to cause the device to discriminate between different polarizations of an optical signal.

2. The device of claim 1, further comprising an anti-reflective coating layer disposed on the frontside of the light-sensing medium and generally surrounding the second contact.

3. The device of claim 1, wherein the light-sensing medium further comprises a semiconductor material that can be optically stimulated.

4. The device of claim 1, wherein the spin filter medium further comprises alternating layers of magnetic material and non-magnetic material.

5. The device of claim 1, wherein the spin filter medium further comprises a Giant Magnetoresistance (GMR) multilayer stack.

6. The device of claim 1, wherein the spin filter medium further comprises a Dilute Magnetic Semiconductor (DMS) layer.

7. The device of claim 1, wherein the spin filter medium further comprises a ferromagnetic layer.

8. The device of claim 1, wherein the second contact disposed on the frontside of the light-sensing medium further comprises a transparent conductive material layer.

9. The device of claim 1, further comprising a magnetic field proximate to the spin filter medium that induces a net magnetization in the spin filter medium.

10. The device of claim 9, wherein the magnetic field is an external magnetic field.

11. The device of claim 9, wherein the magnetic field is a local magnetic field.

12. A high-sensitivity, polarized-light discriminator device, comprising:
    a light-sensing substrate having semiconductor characteristics;
    a spin filter layer disposed on the backside of the light-sensing substrate;
    a contact layer disposed on the spin filter layer;
    an anti-reflective coating layer disposed on the frontside of the light-sensing substrate; and
    one or more contacts disposed on the frontside of the light-sensing substrate,
    wherein applying a magnetic field to the device aligns the magnetic moments in the spin filter layer to cause the device to discriminate between different polarizations of an optical signal.

13. The device of claim 12, further comprising an anti-reflective coating layer disposed on the frontside of the light-sensing substrate.

14. The device of claim 12, wherein the light-sensing substrate further comprises a semiconductor material that can be optically stimulated.

15. The device of claim 12, wherein the spin filter layer further comprises alternating layers of magnetic material and non-magnetic material.

16. The device of claim 12, wherein the spin filter layer further comprises a Giant Magnetoresistance (GMR) multilayer stack.

17. The device of claim 12, wherein the spin filter layer further comprises a semiconductor material doped with metal ions so as to exhibit ferromagnetic behavior.

18. The device of claim 12, wherein the spin filter layer further comprises a Dilute Magnetic Semiconductor (DMS) layer.

19. The device of claim 12, wherein the spin filter layer further comprises a ferromagnetic layer.

20. The device of claim 12, wherein the one or more contacts further comprises a grid-like array of contacts disposed on the frontside of the light-sensing substrate.

21. The device of claim 12, wherein the one or more contacts further comprises a transparent conductive material layer.

22. The device of claim 12, further comprising a magnetic field proximate to the spin filter layer that induces a net magnetization in the spin filter layer.

23. The device of claim 22, wherein the magnetic field is an external magnetic field.

24. The device of claim 22, wherein the magnetic field is a local magnetic field.

25. A polarization-selective-light detector array, composing:
    a plurality of photodiodes, each photodiode having a first contact disposed on the backside of a light-sensing medium and a second contact disposed on the frontside of the light-sensing medium
    a spin filter medium incorporated in each of the plurality of photodiodes such that the spin filter medium is disposed between the backside of the light-sensing medium and the first contact, and a variable wavelength splitter proximate the plurality of photodiodes that segments an optical signal into individual wavelengths, wherein applying a magnetic field to the device aligns the magnetic moments in the spin filter medium to cause the device to discriminate between different polarizations of an optical signal.

26. The array of claim 25, wherein the plurality of photodiodes further comprise an anti-reflective coating layer disposed on the frontside of the light-sensing medium and generally surrounding the second contact.

27. The array of claim 25, wherein the light-sensing medium further comprises a semiconductor material that is capable of being optically stimulated.

28. The array of claim 25, wherein the spin filter medium further comprises an alternating stack of magnetic material and non-magnetic material.

29. The array of claim 25, wherein the spin filter medium further comprises a Giant Magnetoresistance (GMR) multilayer stack.

30. The array of claim 25, wherein the spin filter medium further comprises a semiconductor material doped with metal ions so as to exhibit ferromagnetic behavior.

31. The array of claim 25, wherein the spin filter medium further comprises a Dilute Magnetic Semiconductor (DMS) layer.

32. The array of claim 25, wherein the spin filter medium further comprises a ferromagnetic layer.

33. The array of claim 25, wherein the optical signal is generated by an array of Vertical Cavity Surface Emitting Lasers (VCSELs).

34. The array of claim 25, wherein the plurality of photodiodes are electrically addressable concurrently to detect polarization state of all wavelengths.

35. The array of claim 25, wherein the plurality of photodiodes are independently electrically addressable to detect polarization state of individual wavelengths.

36. The array of claim 25, further comprising a magnetic field proximate to the array that induces a net magnetization in the spin filter medium of the plurality of photodiodes.

37. The array of claim 36, wherein the magnetic field is an external magnetic field.

38. The array of claim 36, wherein the magnetic field is a local magnetic field.

* * * * *